(12) United States Patent
Mielke (10) Patent No.: US 12,306,250 B2
(45) Date of Patent: May 20, 2025

(54) INTEGRATED CIRCUIT, AN APPARATUS FOR TESTING AN INTEGRATED CIRCUIT, A METHOD FOR TESTING AN INTEGRATED CIRCUIT AND A COMPUTER PROGRAM FOR IMPLEMENTING THIS METHOD USING MAGNETIC FIELD

(71) Applicant: ADVANTEST CORPORATION, Tokyo (JP)

(72) Inventor: Frank Mielke, Willich (DE)

(73) Assignee: Advantest Corporation, Tokyo (JP)

( * ) Notice: Subject to any disclaimer, the term of this patent is extended or adjusted under 35 U.S.C. 154(b) by 148 days.

(21) Appl. No.: 18/074,249

(22) Filed: Dec. 2, 2022

(65) Prior Publication Data
US 2023/0099503 A1    Mar. 30, 2023

Related U.S. Application Data

(63) Continuation of application No. PCT/EP2021/052190, filed on Jan. 29, 2021.

(51) Int. Cl.
*G01R 31/319*    (2006.01)
*G01R 31/3185*    (2006.01)

(52) U.S. Cl.
CPC ... *G01R 31/319* (2013.01); *G01R 31/318536* (2013.01)

(58) Field of Classification Search
CPC .......... G01R 31/319; G01R 31/318536; G01R 33/12; G01R 31/318533; G01R 31/3187; G01R 31/31905

USPC .................. 324/754.29, 754.21, 754.01, 537
See application file for complete search history.

(56) References Cited

U.S. PATENT DOCUMENTS

| | | | |
|---|---|---|---|
| 9,389,945 B1 * | 7/2016 | Press | G06F 11/079 |
| 9,891,280 B2 * | 2/2018 | Ukraintsev | G01R 31/311 |
| 2005/0111253 A1 * | 5/2005 | Park | G11C 29/44 |
| | | | 365/158 |
| 2006/0049823 A1 | 9/2006 | Suzuki | |
| 2009/0066356 A1 | 12/2009 | Slupsky et al. | |
| 2010/0211347 A1 | 8/2010 | Friedrich et al. | |
| 2011/0018533 A1 | 1/2011 | Cesaretti et al. | |
| 2013/0007547 A1 * | 1/2013 | Tekumalla | G01R 31/318536 |
| | | | 714/E11.155 |
| 2014/0139209 A1 * | 5/2014 | Lee | G11C 29/56016 |
| | | | 324/211 |
| 2015/0185285 A1 * | 7/2015 | Kovalev | G01R 31/318572 |
| | | | 714/727 |
| 2016/0276004 A1 | 9/2016 | Lance et al. | |
| 2020/0174070 A1 * | 6/2020 | Schat | G01R 31/318552 |
| 2023/0366930 A1 * | 11/2023 | Chandra | G01R 31/318547 |

* cited by examiner

*Primary Examiner* — Giovanni Astacio-Oquendo (57) ABSTRACT

The invention describes an integrated circuit, comprising a functional circuit structure which is configured to provide a functionality; and a test structure configured to set a signal, which is coupled to the functional circuit structure, to a test value in response to a magnetic field impulse, to control a test of the integrated circuit. The invention also describes an apparatus and a method for testing an integrated circuit and a computer program implementing the method. This invention provides a time-effective and cost-effective concept of component testing using magnetic interaction.

20 Claims, 4 Drawing Sheets

INTEGRATED CIRCUIT, AN APPARATUS FOR TESTING AN INTEGRATED CIRCUIT, A METHOD FOR TESTING AN INTEGRATED CIRCUIT AND A COMPUTER PROGRAM FOR IMPLEMENTING THIS METHOD USING MAGNETIC FIELD

CROSS-REFERENCE TO RELATED APPLICATIONS

This is a continuation of PCT Patent Application No. PCT/EP2021/052190 filed Jan. 29, 2021, which is incorporated herein in its entirety.

TECHNICAL FIELD

Embodiments according to the present application are concerned with testing of integrated circuits, and particularly with using magnetic interaction for testing. Embodiments according to the invention are also related to an integrated circuit. Embodiments according to the invention are also related to an apparatus for testing an integrated circuit. Further embodiments according to the invention are related to a method for testing an integrated circuit. Further embodiments according to the invention are related to a computer program for performing a method for testing an integrated circuit. According to an aspect, embodiments according to the invention can be applied to provide a time-effective and cost-effective concept of component testing using magnetic interaction.

BACKGROUND OF THE INVENTION

A multitude of testing apparatuses and methods using magnetic interaction is currently known. Complex components, such as logic circuits, sometimes require structural tests in order to detect faulty circuit parts and elements and thus to ensure functionality and quality. A widespread testing method for testing logic circuits is a SCAN test.

Figure 1:
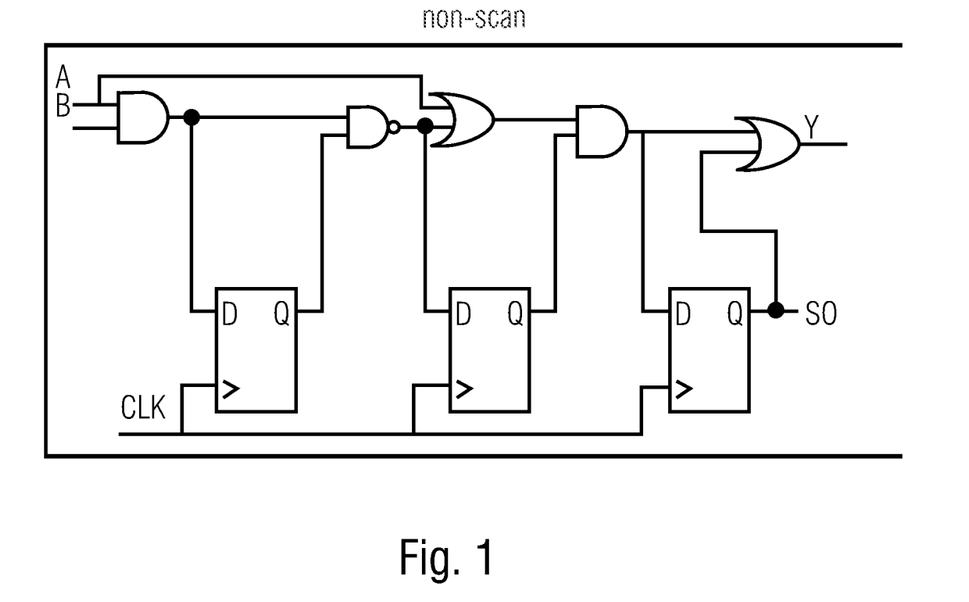
FIG. 1 shows an integrated circuit as known from the prior art.
Figure 2:
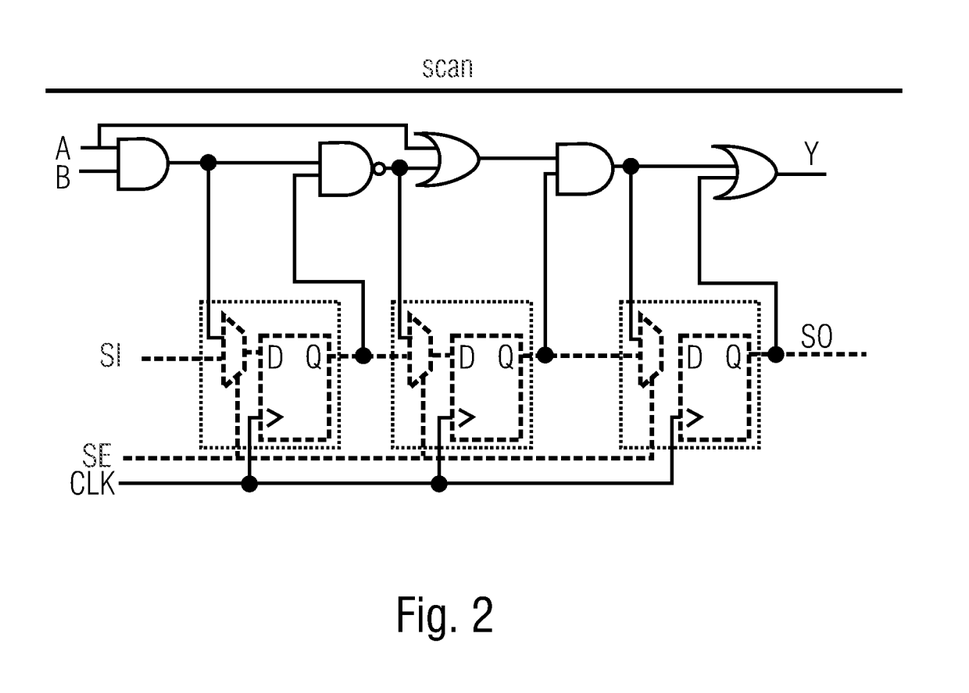
FIG. 2 shows an integrated circuit as known from the prior art.

FIGS. 1 and 2 show an example of testing a device under test (DUT) without using a SCAN test and with implementing a SCAN test in the device under test (DUT). FIG. 1 shows an integrated circuit to be tested without "scan cells". Without scan cells, testing of the circuit is generally limited to the inputs and outputs of the circuit. FIG. 2 shows the integrated circuit where design's flip-flops were modified to allow them to function as stimulus and observation points, or "scan cells" during test, while performing their intended functional role during normal operation. The modified flip-flops, or scan cells, allow the overall design to be viewed as many small segments of combinational logic that can be more easily tested.

A disadvantage of using the SCAN test with the complex logic is that the scan chain must be loaded often to reach sufficiently high-test coverage. For example, more than 99% of scan chain loading is required for high quality products to reach high test coverage. Therefore, although most of the circuit area is easy to reach, the chain must be always fully loaded. This leads to the problem with implementing additional test options, since additional test options in complex areas have significant impact on test time and test costs.

In view of the above, there is a desire to create testing concept, which provides an improved tradeoff between reliability, test coverage and time and cost of test.

SUMMARY OF THE INVENTION

An embodiment according to the invention creates an integrated circuit, comprising: a functional circuit structure which is configured to provide a functionality, e.g., a useful or e.g. a desired functionality; and a test structure, also designated e.g. as "test circuit", configured to set a signal, which is coupled to the functional circuit structure, to a test value in response to a magnetic field impulse, to control a test of the integrated circuit, e.g. a test of the functional circuit structure.

This embodiment according to the invention is based on the finding that a test of the integrated circuit can be facilitated (or accelerated) by wirelessly (using the magnetic field pulse) determining (or changing, or triggering) a signal, which controls the test of the integrated circuit. By having the possibility to influence the test of the integrated circuit in a wireless manner, it is possible to introduce additional test functionalities without adding extra pins to the integrated circuit and/or without adding significant test time and/or without the need to route additional signals on the integrated circuit. For example, by having a test structure which is responsive to a magnetic field pulse, the signal provided by the test structure can be influenced directly and instantaneously by generating a magnetic field pulse while avoiding the need to clock a value through a scan chain or even a scan tree.

Thus, usage of a test structure which is responsive to a magnetic field pulse allows to influence a test of the integrated circuit at one or more arbitrary locations of the integrated circuit while eliminating delays (and an increase in test time) which is normally caused by scan chains. For example, the test structure, which is responsive to a magnetic field impulse, is well suited to trigger "simple" test operations, like the activation or deactivation of a component, reset operations, a setting of certain registers to a desired default value or the like, which would normally require a dedicated signal line (or even a dedicated pin of the integrated circuit) or a lengthy scan chain operation. As an example, including one or more additional new circuits (e.g., one or more test structures which are responsive to a magnetic field impulse) in design for test (DFT) parts for structural tests enables testing partial areas without full loading of the scan chain, e.g., due to induction, e.g., intervening, in SCAN test. Additional possibilities of using magnetic fields, e.g., dynamic magnetic fields, in SCAN tests, are thus created, which helps to decrease time and cost of test.

According to an embodiment, the integrated circuit comprises a plurality of test structures, which may, for example, be configured to set a plurality of signals, which are coupled to the functional circuit structure and which may, for example, support a test of the functional circuit structure, simultaneously, for example in response to a commonly used magnetic field impulse. The test structures, for example, may set the signals, which are coupled to the functional circuit structure, to respective test values. The time of the test could be further decreased due to simultaneous functioning of multiple test structures from the plurality of the test structures. For example, a time-synchronous influence on a test of the integrated circuit can be affected using such a concept, without having the need to distribute a joint trigger signal across the integrated circuit. For example, the externally generated magnetic field impulse typically occurs at different locations of the integrated circuit simultaneously. In contrast, a high routing effort would be required to distribute a signal across the integrated circuit to arrive at different locations of the integrated circuit simultaneously. Thus, by having a plurality of test structures which are responsive to a magnetic field pulse, it is easily possible, without a significant wiring effort, to simultaneously trigger or set certain test functionalities at different locations of the integrated circuit.

According to an embodiment, the test value is dependent on at least one of: an orientation of the magnetic field, a strength of the magnetic field, a dynamic change of the orientation of the magnetic field, e.g., a vector of the magnetic field, a dynamic change of the strength of the magnetic field, e.g., a vector change of the magnetic field. This embodiment is based on the idea that it is possible to externally influence the test value by an appropriate generation of the magnetic field. For example, by externally adjusting the orientation of the magnetic field of the magnetic field impulse, it can be determined whether the test value is set to a "0" value or to a "1" value. Moreover, other (externally controllable) characteristics of the magnetic field, or of the magnetic field pulse (e.g. the strength of the magnetic field, the dynamic change of the orientation of the magnetic field, e.g., a vector of the magnetic field, the dynamic change of the strength of the magnetic field, e.g., a vector change of the magnetic field) may be used to adjust the test value which is provided by the test structure in response to the magnetic field pulse. Thus, a high degree of flexibility exists for an external influencing of the test value generated by the test structure.

According to an embodiment, the test structure is configured to set one or more flipflops of a scan chain, which may, for example, be used for a test of the functional circuit structure, for example, by providing test signals to the functional circuit structure, to one or more test values. One or more inner flipflops of the scan chain may be, for example, set to test values directly without clocking a sequence of values through the whole scan chain. For example, the test value may be injected into a flipflop, e.g., an inner flipflop, of the scan chain, bypassing one or more preceding flipflops of the scan chain. Accordingly, there is no need to load the whole scan chain, since the test value is, for example, injected into a particular flipflop bypassing preceding flipflops of the scan chain. The speed of the testing will increase with corresponding decreasing of the cost of the testing. As a consequence, it is possible to determine values of one or more "inner" flipflops of the test chain in a highly efficient (and possible well time-synchronized) manner using a magnetic field impulse.

According to an embodiment, the test structure is configured to provide a control signal for one or more multiplexers of the scan chain, a clock signal for one or more flipflops of the scan chain and a data signal for one or more flipflops of the scan chain, e.g., for the one or more flipflops of the scan chain for which a clock signal is provided by the test structure. A direct control of the particular flipflop of the scan chain is provided (e.g., on the basis of the multiplexer control signals, the clock signal and the data signal) along with a bypassing of preceding flipflops of the scan chain.

According to an embodiment, an input-sided (e.g., input-sided with respect to the associated flipflop, not with respect to the entire scan chain) multiplexer, which may be for example part of the scan chain, e.g., a data multiplexer, is associated to a given one of the scan chain flipflops, e.g., to one of the flipflops of the scan chain. The input-sided multiplexer is configured to selectably couple the data input of the given scan chain flipflop to an output of a logic function, e.g., a gate, of the functional circuit structure, e.g., useful circuit, or to an output of a preceding scan chain flip flop, e.g., of the scan chain, or to a data output of the test structure. The test structure is configured to provide a multiplexer control signal, to set the input-sided multiplexer associated with the given scan chain flipflop to couple the data output of the test structure to the data input of the given scan chain flipflop, in response to a magnetic field impulse. Accordingly, the given scan chain flipflop can be loaded with a predetermined value, or with a value determined by the magnetic impulse or by a characteristic of the magnetic impulse (rather than with an output value of a preceding flipflop of the scan chain). Thus, it is possible to set a value of the given scan chain flipflop independent from the output value of the preceding flip flop of the scan chain in response to the magnetic field impulse. Thus, a test of partial areas of the scan chain may be performed, or a specific inner flipflop of the scan chain can be directly set to a test value.

According to an embodiment, a clock multiplexer is associated with the given scan chain flipflop, wherein the clock multiplexer is configured to selectably couple a clock input of the given scan chain flipflop to a scan chain clock signal, e.g., a clock signal common for all flipflops of the scan chain, or to a clock output of the test structure. The test structure is configured to provide a multiplexer control signal (which may, for example, be equal to the multiplexer control signal used to control the input-sided multiplexer or data multiplexer), to set the clock multiplexer associated with the given scan chain flipflop to couple the clock output of the test structure to the clock input of the given scan chain flipflop, in response to a magnetic field impulse. Accordingly, the given scan chain flipflop can be "loaded" under the control of the test structure in response to the magnetic field pulse. In other words, the given scan chain flipflop is no longer under the control of the common scan chain clock signal in this case, but rather a time at which data is loaded into the given scan chain flipflop is determined by the test structure in this case. Accordingly, a timing can be well controlled by the magnetic field pulse. Thus, a test of partial areas of the scan chain may be performed, with manipulation of local clock gating, e.g., several times during one normal shift pattern.

According to an embodiment, the test circuit is configured to provide a clock signal for the given scan chain flipflop in response to the magnetic field impulse. A manipulation of local clock gating at the particular scan chain flipflop is achieved. In particular, a time at which a certain value is taken over into the given scan chain flipflop can be determined by the test structure, e.g., in response to (or under the control of) the magnetic field impulse.

According to an embodiment, the test structure is configured to provide a sequence, comprising a setting of the data output, e.g., of the test structure, a transition of the multiplexer control signal, e.g., of the test structure, and a transition of the clock signal, e.g., of the test structure, in response to the magnetic field impulse. Thus, the test structure can control which data is taken over into the given scan chain flipflop at which time. Also, obeyance of the setup-and-hold times of the given scan chain flipflop can be ensured by the test structure by providing a well-defined sequence.

According to an embodiment, the test structure comprises an induction element, which may, for example, be able to provide a voltage pulse or a current pulse in response to a magnetic field impulse, and an amplifier configured to amplify a signal provided by the induction element, e.g., the voltage pulse or the current pulse. The scan chain areas which are difficult to reach, e.g., complex areas, limit test options in these areas, thus having significant impact on test time and cost. By installing an additional induction element in these complex areas, these areas could be tested in an improved manner, e.g., several times during one normal shift pattern. Moreover, usage of an induction element and of an amplifier may provide a high sensitivity to magnetic field impulses while keeping a required chip area reasonably small.

The implementation of induction switching element can also be helpful to change a process control monitoring (PCM) parameter measurement or to switch, for example, a ring oscillator on and off.

According to an embodiment, the test structure is configured to activate and/or deactivate a test support circuit, e.g., a ring oscillator, a self-test circuit, etc., in response to the magnetic field impulse. This can enhance a monitoring capability of parameters (e.g., PCM parameters) inside the devices and inside PCM circuits in the kerf to improve an estimation of process variations.

According to an aspect, the test structure is configured to manipulate a scan enable signal controlling a multiplexer coupled to a data input of a scan chain flipflop in response to a magnetic field impulse. For example, the test structure may set the scan enable signal of a given scan chain flipflop to a value which is different from a scan enable signal applied to other scan chain flipflops of the scan chain. Accordingly, a scan chain stage comprising the given scan chain flipflop may be set into a "normal operation" mode (inputting data from the useful circuit) while other scan chain stages of the scan chain may be set to a "scan chain" mode, forwarding data from respective preceding scan chain flipflops. Thus, it is, for example, possible to have a part of the useful circuit in normal operation while another part of the useful circuit is inactive because the scan chain is used to clock out data. This also allows for an acquisition of multiple data from certain parts of the useful circuit (e.g., coupled to the given scan chain stage) while avoiding a take-over of data into the scan chain from other parts of the useful circuit. Consequently, particularly relevant data can be read out from the integrated circuit under test in a particularly efficient manner.

According to an aspect, the test structure is configured to manipulate (e.g., disable, or clock) a scan chain clock signal for a given scan chain flipflop in response to a magnetic field impulse. Thus, for example, multiple data values may be taken over into the scan chain from a part of the useful circuit coupled to the given scan chain flipflop, while no data may be taken over into the scan chain from another part of the useful circuit coupled to another scan chain flipflop of the scan chain. This may allow for a particularly efficient readout of data.

According to an embodiment, the test structure comprises an induction element and a scan enable, SE, multiplexer associated with the induction element and a given scan chain flipflop; wherein the induction element is configured to provide a SE multiplexer control signal, to set the SE multiplexer to couple an SE output of the test structure to the input-sided multiplexer associated with the given scan chain flipflop, in response to a magnetic field impulse. Manipulation of SE signal or clock-gating with induction element provides an efficient way to capture some values into the scan chain. For example, instead of one capture cycle for all logical blocks in testing several capture cycles for one logical block are provided.

An embodiment according to the invention creates an apparatus for testing an integrated circuit, e.g., an automated test equipment. The apparatus is configured to generate a magnetic field impulse, in order to thereby, e.g., wirelessly, set a signal, e.g., a digital signal, within the integrated circuit, which may, for example, be an integrated circuit as defined before, to a predetermined value.

This embodiment is based on the ideas discussed above with respect to the integrated circuit and can optionally be supplemented by any of the features, functionalities and details discussed with respect to the integrated circuit.

Moreover, this embodiment is based on the finding that providing a magnetic field impulse to an integrated circuit configured to set a signal to a test value in response to the magnetic field impulse enables, for example, testing partial areas of the integrated circuit without full loading of the scan chain due to induction, e.g., intervening in SCAN test.

According to an embodiment, the apparatus is configured to generate the magnetic field impulse in synchronism with a test program. The synchronization in magnetic field impulse delivery and data acquisition during test allows to combine a conventional testing concept, e.g., using a provision of stimulus signals for the integrated circuit under test by an automated test equipment and/or using a provision of input signals for a scan chain of the integrated circuit under test by an automated test equipment, which an influencing of the integrated circuit via a magnetic field impulse. Thus, it is possible to accelerate a test by supplementing conventional test concepts with a possibility to set one or more test functionalities using a magnetic field impulse. A good timing synchronism between the generation of the magnetic field impulse and the execution of the test program provides a good reliability of measured parameters, thus increasing the accuracy of the testing results.

An embodiment according to the invention creates an integrated circuit, comprising: a process control monitoring structure, which may, for example, be configured to allow for a measurement of one or more parameters of the integrated circuit during a manufacture of the integrated circuit; and a control structure, which may, for example, correspond to the test structure or "test circuit" mentioned before, or which may be designated as an "induction switching element", configured to adapt, e.g. switch or change between two or more states, an operation of the process control monitoring structure in response to a magnetic field impulse.

This embodiment is based on the finding that introducing a control structure, particularly an induction switching element, enables an adaptation or influencing of the process control monitoring structure during the manufacturing process, and thus enables introducing adjustments during the manufacturing in a more simple (e.g., contactless) and more time-effective way.

According to an embodiment, the control structure is configured to set a signal, which is coupled to the process control monitoring structure, in response to a magnetic field impulse, to control an operation of the process control monitoring structure. Consequently, characteristics of the process control monitoring structure can, for example, be adapted to the needs.

An embodiment according to the invention creates a method for testing an integrated circuit comprising a functional circuit structure, which is configured to provide a functionality, e.g., a useful or e.g., desired functionality. The method comprises setting a signal, which is coupled to the functional circuit structure, to a test value in response to a magnetic field impulse, to control a test of the integrated circuit, e.g., a test of the functional circuit structure.

The method according to this embodiment is based on the same considerations as an apparatus for testing described above. Moreover, this disclosed embodiment may optionally be supplemented by any other features, functionalities and details disclosed herein in connection with the apparatus for testing, both individually and taken in combination.

An embodiment according to the invention creates a computer program having a program code for performing, when running on a computer, the methods according to any of embodiments described above.

The embodiments according to the invention can be effectively used in the SCAN test of the complex logic circuits and provide an improved tradeoff between reliability, test coverage and time and cost of test. These and further advantageous aspects are the subject of the dependent claims.

The integrated circuit, the apparatus for testing a component, the method for testing a component and the computer program for implementing this method may optionally be supplemented by any of the features, functionalities and details disclosed herein (in the entire document), both individually and taken in combination.

BRIEF DESCRIPTION OF THE FIGURES

Preferred embodiments of the present application are set out below taking reference to the figures among which.

DETAILED DESCRIPTION

Figure 3:
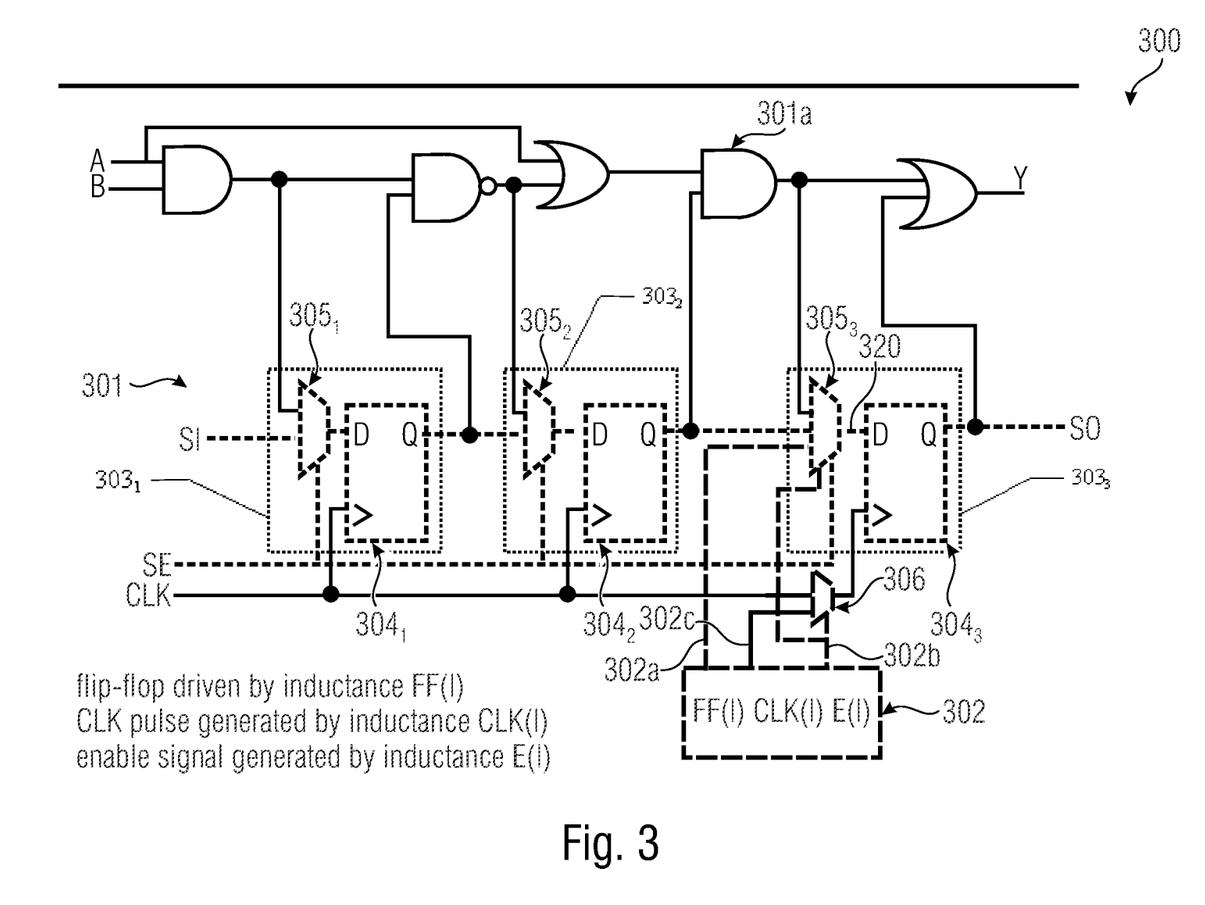
FIG. 3 shows an integrated circuit in accordance with an embodiment.

FIG. 3 shows an integrated circuit 300 in accordance with an embodiment. The integrated circuit 300 comprises a functional circuit structure 301 and a test structure or a test circuit 302. The test structure or test circuit 302 can be integrated with the functional circuit structure 301. For example, the test structure or test circuit 302 can be integrated in the functional circuit structure 301 on a monolithic integrated circuit 300 die or wafer of a plurality of die. The functional circuit structure 301 is configured to provide a useful or desired or other functionality. The test structure or test circuit 302 is configured to test one or more aspects of the functionality of the functional circuit structure. The test structure or a test circuit 302 is configured to set a signal (e.g., the data signal 302a), which is coupled to the functional circuit structure 301, to a test value (e.g., a logic "0" or a logic "1") in response to a magnetic field impulse, to control a test of the integrated circuit 300, for example upon performing a test of the functional circuit structure 301 of the integrated circuit 300. The test value may be, for example, dependent on an orientation of the magnetic field.

The test structure can include a plurality of scan cells (e.g., scan cells 3031, 3032, 3033) that can be selectively coupled to form one or more scan chains. The scan cell configured in a scan chain provide a way to set and observe states in the functional circuit structure 301 for testing its functionality. The scan cells can be, but are not limited to, flipflops, latches or similar circuits for storing state information. The scan chains general include an input scan signal (SI), an output scan signal (SO), a scan enable signal (SE), and a scan clock signal (CLK). The scan enable signal provides for enabling or selectively coupling a set of scan cells as a scan chain. For example, a given state of the scan enable signal configures a given set of scan cells into a shift register. The scan clock signal can control the scan cells of the scan chain during a shift phase and a capture phase. In one implementation, the scan cells can include but are not limited to a flipflop 304 and a multiplexor 305. The scan clock signal can cause the scan chain to set a scan pattern loaded in the scan chain into the function circuit structure 301. For example, one or more states of the functional circuit structure can be set, based on a scan pattern in the scan chain, in response to the scan clock signal.

Due to including an additional test structure or test circuit 302, partial areas of the integrated circuit 300 may be tested without full loading of the whole scan chain shown in FIG. 3 (e.g., the scan chain comprising flipflops $304_1$, $304_2$, $304_3$ and corresponding input multiplexers $305_1$, $305_2$, $305_3$).

Although FIG. 3 shows only one test structure or test circuit 302, the integrated circuit 300 may comprise a plurality of test structures or test circuits 302, which may, for example, be configured to set a plurality of signals, which are coupled to the functional circuit structure 301 and which may, for example, support a test of the functional circuit structure 301, simultaneously, for example in response to a commonly used magnetic field impulse.

As shown in FIG. 3, the integrated circuit 300 comprises one or more flipflops $304_{1-3}$, which may, in a normal operation of the integrated circuit, store data relevant for the functionality of the integrated circuit. The flipflops $304_{1-3}$ may be configured to act as a scan chain in a test mode of the integrated circuit, for example by a setting of the input multiplexers $305_1$ to $305_3$ associated with the flipflops in response to an active scan chain enable signal SE.

The test structure 302 is configured to set one or more of the flipflops $304_{1-3}$ (e.g., flipflop $304_3$) of the scan chain, which may, for example, be used for a test of the functional circuit structure 301, for example, by providing test signals to the functional circuit structure 301, to one or more test values.

FIG. 3 shows particularly that the test structure 302 sets the flipflop $304_3$ of the scan chain to a test value, which may be determined by signal 302a. The flipflop $304_3$ of the scan chain may be set to the test value directly without clocking a sequence of values through the whole scan chain, e.g., bypassing the preceding flipflops $304_{1-3}$ of the scan chain.

The test structure 302 is shown to provide a control signal 302a for a multiplexer $305_3$ of the scan chain (inputs of which are connected to an output of a circuit element 301a of the circuit 301, to a data output Q of a preceding scan chain flipflop $304_2$ and to a data output of the test structure 302) and an output of which is connected to a data input D of the flipflop $304_3$), a clock signal 302c and a data signal 302a for the flipflop $304_3$ of the scan chain. The multiplexer $305_3$ is associated to the flipflop $304_3$ and is configured to selectably couple the data input of the flipflop $304_3$ to an output of a logic function, e.g., a gate 301a, of the functional circuit structure 301 or to an output Q of a preceding scan chain flipflop $304_2$, or to a data output of the test structure 302. The test structure controls the multiplexer $305_3$ by providing a multiplexer control signal 302b, to set the multiplexer $305_3$ to couple the data output of the test structure 302 to the data input D of the flipflop $304_3$, in response to a magnetic field impulse.

The integrated circuit 300 comprises a clock multiplexer 306 associated with the flipflop $304_3$ and configured to selectably couple a clock input ">" of the flipflop $304_3$ to a scan chain clock signal CLK or to a clock output of the test structure 302. The test structure 302 may provide the multiplexer control signal 302c to the clock multiplexer 306 to set the clock multiplexer 306 to couple the clock output of the test structure 302 to the clock input ">" of the flipflop 304₃, in response to a magnetic field impulse.

The test circuit or test structure 302 also provides a clock signal 302c for the flipflop 304₃ in response to the magnetic field impulse.

In an alternative embodiment, the test structure 302 may be configured to activate and/or deactivate a test support circuit, e.g., a ring oscillator, a self-test circuit, etc., in response to the magnetic field impulse.

According to another aspect of the invention, the test structure may be configured to enhance a process control monitoring (PCM). In manufacturing and process development, the PCM structures inside the kerf but also process monitoring inside the devices are more and more important to judge on process variations. Clockless switching elements like elements using inductance and external magnetic fields can be used to enhance the monitoring capability—this would help to improve manufacturing processes and yield ramp. In other words, the test structure 302 may, for example, provide its output signal to a process control monitoring circuit or structure (e.g., in the kerf region of the integrated circuit), to thereby influence characteristics of the process control monitoring circuit or structure.

However, it should be noted that the integrated circuit 300 may optionally be supplemented by any of the features, functionalities and details disclosed herein, both individually or taken in combination.

Figure 4:
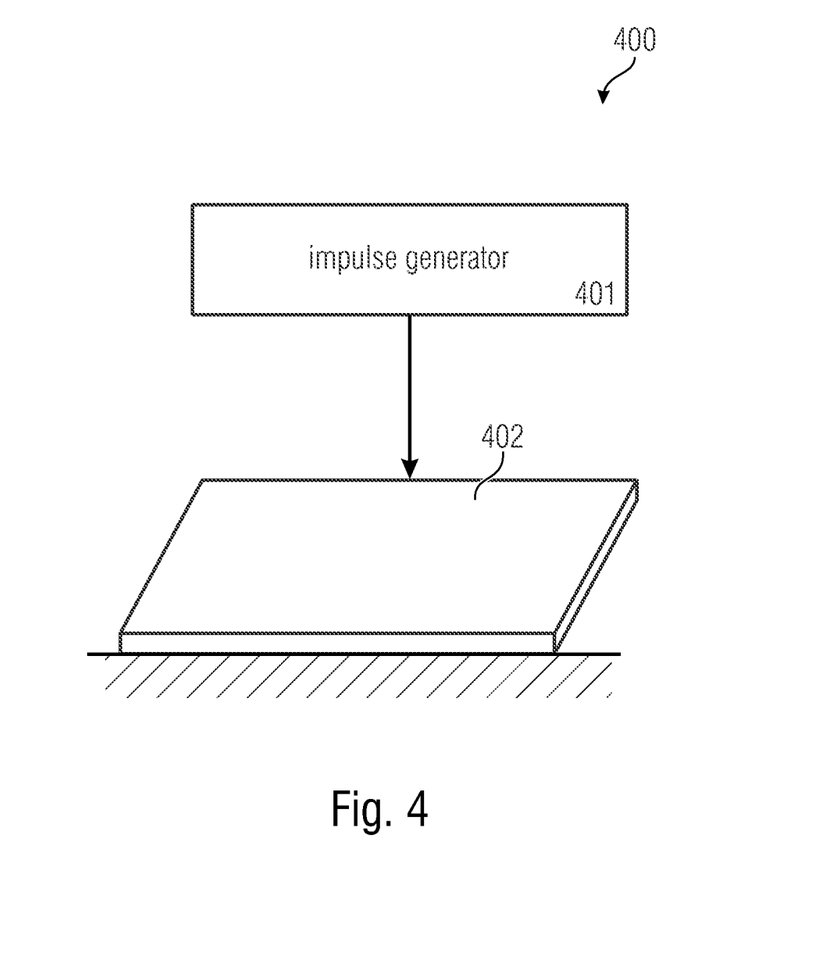
FIG. 4 shows an apparatus for testing an integrated circuit in accordance with an embodiment.

FIG. 4 shows an apparatus 400 for testing an integrated circuit, e.g., an automated test equipment. The apparatus 400 comprises means 401 to generate a magnetic field impulse, e.g., a magnetic field impulse generator 401. The means 401 provides the magnetic field impulse to an integrated circuit 402 under test and thereby, e.g., wirelessly, sets a signal, e.g., a digital signal, within the integrated circuit 402 to a predetermined value. The integrated circuit 402 may, for example, be an integrated circuit 300 as defined before with reference to FIG. 3 and the signal which is set may, for example, be the output signal of the flipflop 304₃. The magnetic field impulse may be generated in synchronism with a test program.

However, it should be noted that the apparatus 400 may optionally be supplemented by any of the features, functionalities and details disclosed herein, both individually or taken in combination.

Figure 5:
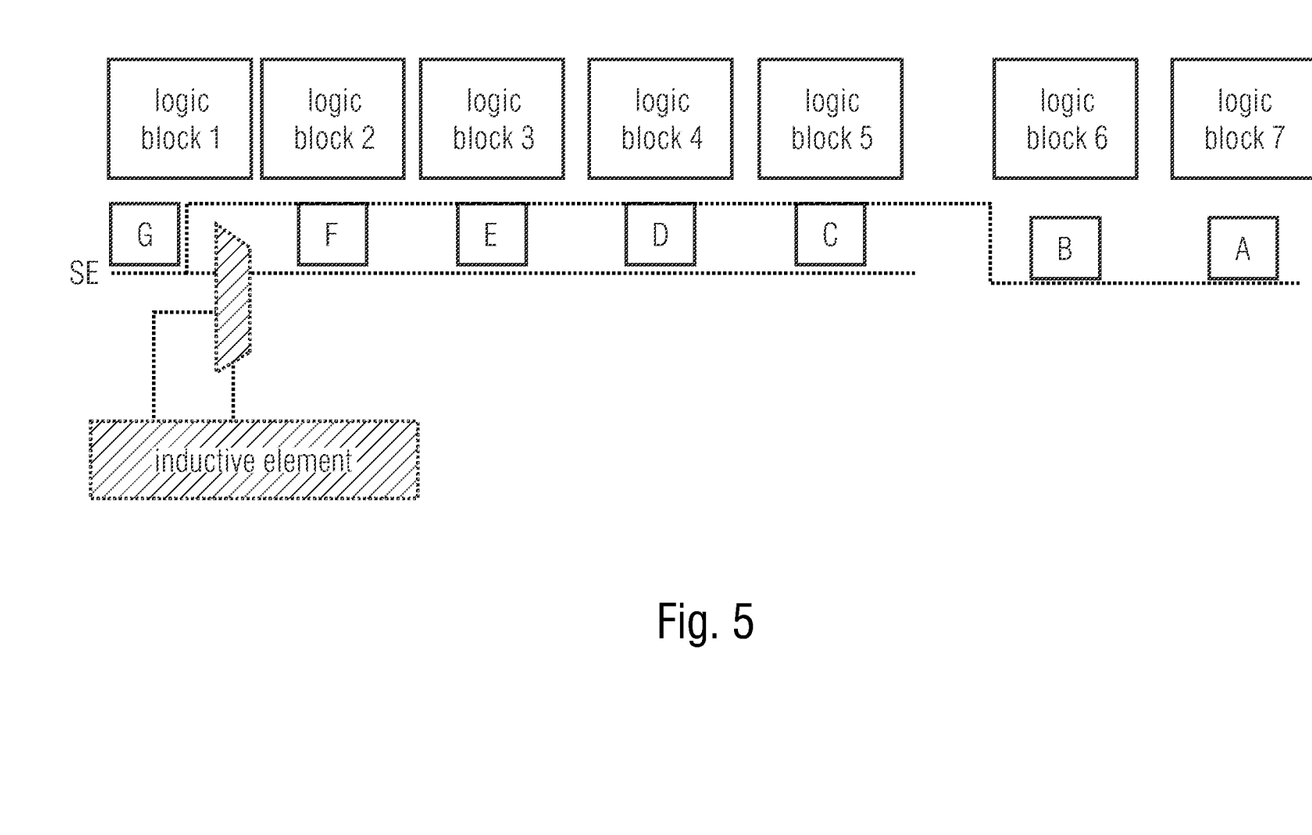
FIG. 5 shows switching of the scan chain in accordance with an embodiment.

FIG. 5 shows an example of manipulation of SE signal (scan-enable) and/or clock-gating with induction switching element in order to avoid a capture of some values into scan-chain in accordance with an embodiment.

As shown in FIG. 5, a scan-chain is subdivided into several parts, for example A,B,C,D,E,F,G.

SI (scan-in)→G—F—E—D—C—B—A→

If a multiplexer is implemented with inductive element to generate enable & data it will be able for example to do instead of one capture cycle for all blocks several capture cycles for one block.

In other words, the "multiplexer with inductive element", or a multiplexer, a control signal may, for example, be controlled by the test structure described herein, and may, for example, be set to a multiplexer status which is different from multiplexer status of other scan chain multiplexers (which are typically controlled by a common scan chain enable (SE) signal which is, for example, common for all multiplexers of the scan chain). Normal scan operation would, for example, be:
shift-in A—G→capture cycle for all blocks→shift out A—G In this case, scan chain enable may, for example, be active during the shift-in operation and during the shift out operation and inactive for the capture cycle.

Changed operation would, for example, be (generate a "1" for SE for blocks C,D,E,F) (e.g., while SE is inactive or "0" for block G):
shift-in 1 part (G is filled)→capture cycle (focus on block1)→shift in 1 part (G,F are filled)→
capture cycle (focus on block1)→shift in 1 part (G,F,E are filled) . . . .

After 5 times capture the chain will be shifted out and get in G,F,E,D and C data of block1. It should be noted that A,B,C,D,E,F,G may be single flipflops, but also a part of a chain of multiple flip-flops.

For example, by selectively disabling the SE signal for flipflop (or flipflop group) G under the control of the test structure, while SE is active for other flipflops (e.g., flipflops or flipflop groups C,D,E,F), flipflop G (or flipflop group) is repeatedly loaded with output values of the useful circuit, while flipflops (or flipflop groups) C,D,E,F act as a scan chain and shift through multiple values provided by or loaded to flipflop (or flipflop group) G from the useful circuit. Thus, multiple subsequent sample values of the useful circuit coupled to the input of flipflop (or flipflop group) G may, for example, be shifted through the scan chain as a sequence, while, for example, no output values of the useful circuit are loaded to flipflops (or flipflop groups) C, D, E, F in this operating state.

To conclude, the test structure may, for example, set individual stages of the scan chain to an operation state (e.g., scan enable disabled) which is different from the states (e.g., scan enable enabled) of other stages of the scan chain, e.g., in response to a magnetic field impulse.

Further Embodiments and Aspects

In the following, further aspects and embodiments according to the invention will be described, which can be used individually or in combination with any other embodiments disclosed herein.

Moreover, the embodiments disclosed in this section may optionally be supplemented by any other features, functionalities and details disclosed herein, both individually and taken in combination.

In the following, a concept will be described which can be used for using magnetic fields to improve test coverage of SOCs (or of other integrated circuits) and silicon technology enablement.

In the following, an idea underlying embodiments of the invention will be described.

Embodiments according to the invention are based on adding test conditions and/or DFT features to cover additional failure modes, to reduce test costs and to increase quality.

In the following, some goals and purposes of the invention will be described which may be reached (at least partly) in some or all of the embodiments.

Complex semiconductor devices (e.g., SOCs for mobile radio applications or in automotive industry) sometimes require structural tests in order to detect faulty circuit parts and elements and thus to ensure functionality and quality. Widespread methods are the SCAN test for logic circuits and MBIST for integrated memories.

Due to the increasing complexity and quality requirements, e.g., in the automotive industry, but also due to new silicon technologies, the current methods reach their limits, so that test gaps arise or test costs increase heavily.

To overcome those issues, the idea of the embodiments according to the invention is to use additional physical parameters to improve or to introduce new structural tests.

Usual test conditions in the conventional methods consider various parameters, such as temperature, current consumption, switching thresholds (voltage) or max. functional frequency.

It has been found that testing under static and/or dynamic magnetic fields and the (optional) introduction of test circuits that interact with magnetic fields can provide additional information on sources of error and/or on quality risks. It has been found that this can significantly improve the quality of the deliveries.

According to an aspect of the invention, another possibility of usage of magnetic interaction for testing is to include additional new circuits in DFT parts for structural tests so that additional possibilities with dynamic magnetic fields are created by induction, e.g., intervene in SCAN test. Complex logic has the disadvantage that the scan chains must be loaded often to reach sufficiently high-test coverage (it should be >99% for high quality products). However, most of the circuit area is easy to reach but the chains must always be fully loaded, therefore, additional test options in complex areas have significant impact on test time and test costs.

According to an aspect of the invention, it has been found that if, for example, additional induction switching elements are installed in these critical areas, one could (or can) e.g., test partial areas, e.g., with manipulation of local clock gating, several times during one normal shift pattern. According to an aspect of the invention, it has been found that other additional test logic could (or can) also be implemented with help of induction switching elements without connection to the clock/reset system (e.g., changeable scan cells or switchable delay elements).

FIG. 1 shows an integrated circuit to be tested without "scan cells" (non-scan). FIG. 2 shows the integrated circuit where design's flip-flops were modified to allow them to function as "scan cells" (scan). FIG. 3 shows an integrated circuit (scan with inductance cell enhancement) in accordance with an embodiment of the invention.

The implementation of induction switching elements can also be helpful to change PCM parameter measurements or to switch ringo's on and off.

In manufacturing and process development the PCM structures inside the kerf but also process monitoring inside the devices are more and more important to judge on process variations. According to an aspect of the invention, clockless switching elements like elements using inductance and external magnetic fields can be used to enhance the monitoring capability—this would help to improve manufacturing processes and yield ramp.

Moreover, it should be noted that the embodiments and procedures may be used as described in this section, and may optionally be supplemented by any of the features, functionalities and details disclosed herein (in this entire document), both individually and taken in combination.

However, the features, functionalities and details described in any other chapters can also, optionally, be introduced into the embodiments according to the present invention.

Also, the embodiments described in the above-mentioned chapters can be used individually, and can also be supplemented by any of the features, functionalities and details in another chapter.

Also, it should be noted that individual aspects described herein can be used individually or in combination. Thus, details can be added to each of said individual aspects without adding details to another one of said aspects.

In particular, embodiments are also described in the claims. The embodiments described in the claims can optionally be supplemented by any of the features, functionalities and details as described herein, both individually and in combination.

Moreover, features and functionalities disclosed herein relating to a method can also be used in an apparatus (configured to perform such functionality). Furthermore, any features and functionalities disclosed herein with respect to an apparatus can also be used in a corresponding method. In other words, the methods disclosed herein can be supplemented by any of the features and functionalities described with respect to the apparatuses.

Also, any of the features and functionalities described herein can be implemented in hardware or in software, or using a combination of hardware and software, as will be described in the section "implementation alternatives".

Implementation Alternatives

Although some aspects are described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine-readable carrier.

Other embodiments comprise the computer program for performing one of the methods described herein, stored on a machine-readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitory.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The apparatus described herein may be implemented using a hardware apparatus, or using a computer, or using a combination of a hardware apparatus and a computer.

The apparatus described herein, or any components of the apparatus described herein, may be implemented at least partially in hardware and/or in software.

The methods described herein may be performed using a hardware apparatus, or using a computer, or using a combination of a hardware apparatus and a computer.

The methods described herein, or any components of the apparatus described herein, may be performed at least partially by hardware and/or by software.

The herein described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

The invention claimed is:

1. An integrated circuit, comprising:
a functional circuit structure configured to provide a functionality; and
a test structure, coupled to the functional circuit structure, wherein the test structure is configured to set a signal to a test value, in response to a magnetic field impulse, to control a test of the functional circuit structure by the test structure.

2. The integrated circuit according to claim 1, further comprising:
a plurality of test structures, which are coupled to the functional circuit structure, wherein the plurality of test structures are configured to set respective signals to predetermined test values, in response to the magnetic field impulse, to control the test of the integrated circuit.

3. The integrated circuit according to claim 1, wherein the test value is dependent on at least one of: an orientation of the magnetic field impulse, a strength of the magnetic field impulse, a dynamic change of the orientation of the magnetic field impulse, and a dynamic change of the strength of the magnetic field impulse.

4. The integrated circuit according to claim 1, wherein the test structure is further configured to set one or more scan cells of a scan chain to one or more test values.

5. The integrated circuit according to claim 4, wherein:
the one or more scan cells of the scan chain comprise one or more flipflops and one or more multiplexers; and
the test structure is further configured to provide: a control signal for the one or more multiplexers of the scan chain; a clock signal for the one or more flipflops of the scan chain; and a data signal for the one or more flipflops of the scan chain.

6. The integrated circuit according to claim 5, wherein:
an input-sided multiplexer is associated with a given one of the one or more flipflops of the scan chain,
the input-sided multiplexer is configured to selectably couple a data input of the given one of the one or more flipflops to an output of a logic function of the functional circuit structure or to an output of a preceding one of the one or more flipflops, or to a data output of the test structure, and
the test structure is configured to provide a multiplexer control signal, to set the input-sided multiplexer associated with the given one of the one or more flipflops to couple the data output of the test structure to the data input of the given one of the one or more flipflops, in response to the magnetic field impulse.

7. The integrated circuit according to claim 6, wherein the test structure is configured to provide a sequence, comprising a setting of the data output, a transition of the multiplexer control signal, and a transition of the clock signal, in response to the magnetic field impulse.

8. The integrated circuit according to claim 5 wherein:
a clock multiplexer, associated with a given one of the one or more flipflops of the scan chain, is configured to selectably couple a clock input of the given one of the one or more flipflops to a scan chain clock signal or to a clock output of the test structure, and
the test structure is configured to provide a multiplexer control signal, to set the clock multiplexer associated with the given one of the one or more flipflops to couple the clock output of the test structure to the clock input of the given one of the one or more flipflops, in response to the magnetic field impulse.

9. The integrated circuit according to claim 5, wherein the test structure is further configured to provide a clock signal for a given one of the one or more flipflops of the scan chain in response to the magnetic field impulse.

10. The integrated circuit according to claim 5, wherein the test structure is further configured to manipulate a scan enable signal controlling a multiplexer coupled to a data input of a given one of the one or more flipflops of the scan chain in response to the magnetic field impulse.

11. The integrated circuit according to claim 5, wherein the test structure is further configured to manipulate a scan chain clock signal for a given one of the one or more flipflops of the scan chain in response to the magnetic field impulse.

12. The integrated circuit according to claim 5, wherein:
the test structure comprises an induction element and a scan enable multiplexer associated with the induction element and a given one of the one or more flipflops of the scan chain; and
the induction element is configured to provide a scan enable multiplexer control signal, to set the scan enable multiplexer to couple a scan enable output of the test structure to an input-sided multiplexer associated with a given one of the one or more flipflops, in response to the magnetic field impulse.

13. The integrated circuit according to claim 4, wherein the test structure comprises an induction element and an amplifier configured to amplify a signal provided by the induction element.

14. The integrated circuit according to claim 4, wherein the test structure is further configured to activate and/or deactivate a test support circuit in response to the magnetic field impulse.

15. An integrated circuit, comprising:
a functional circuit structure;
a process control monitoring structure coupled to the functional circuit structure to monitor parameters of the function circuit structure; and
a control structure configured to adapt an operation of the process control monitoring structure to monitor one or more of the parameters of the function circuit structure in response to a magnetic field impulse.

16. The integrated circuit according to claim 15, wherein the control structure is further configured to set a signal, which is coupled to the process control monitoring structure, in response to the magnetic field impulse, to control a monitor operation of the process control monitoring structure.

17. A method for testing an integrated circuit, the integrated circuit including a functional circuit structure configured to provide a functionality and a test structure to control a test of the functional circuit structure, the method comprising:
setting a signal of the test structure, which is communicatively coupled to the functional circuit structure, to a test value in response to a magnetic field impulse;
controlling a test of the integrated circuit by the test structure including capturing a state of the functional circuit structure in response to the test value; and
outputting by the test structure of the functional circuit structure the captured state of the functional circuit structure.

18. The method according to claim 17, wherein setting the signal comprises:
setting a scan cell of the test structure coupled to the functional circuit structure to the test value in response to the magnetic field impulse.

19. The method according to claim 18, wherein controlling the test of the integrated circuit comprises:
configuring the scan cell as part of a scan chain by the test structure in response to a scan enable signal; and
setting one or more states of the functional circuit structure by the test structure, based on a scan pattern including the test value in the scan chain, in response to a scan clock signal.

20. The method according to claim 19, wherein controlling the test of the integrated circuit further comprises:
capturing the state of the functional circuit structure by the test structure or the functional circuit structure in response to the scan clock signal.

* * * * *